(12) United States Patent
Kasai et al.

(10) Patent No.: US 7,319,225 B2
(45) Date of Patent: Jan. 15, 2008

(54) TRANSMISSION ELECTRON MICROSCOPE

(75) Inventors: Hiroto Kasai, Higashimatsuyama (JP); Takaho Yoshida, Higashimatsuyama (JP)

(73) Assignee: Hitachi, Ltd., Tokyo (JP)

( * ) Notice: Subject to any disclaimer, the term of this patent is extended or adjusted under 35 U.S.C. 154(b) by 178 days.

(21) Appl. No.: 11/356,169

(22) Filed: Feb. 17, 2006

(65) Prior Publication Data
US 2006/0255273 A1 Nov. 16, 2006

(30) Foreign Application Priority Data
May 10, 2005 (JP) .............................. 2005-136803

(51) Int. Cl.
*G01N 23/00* (2006.01)
(52) U.S. Cl. ..................................................... 250/311
(58) Field of Classification Search ................. 250/311
See application file for complete search history.

(56) References Cited

FOREIGN PATENT DOCUMENTS

| JP | 05-217536 | 2/1992 |
|---|---|---|
| JP | 2003-229085 | 1/2002 |

OTHER PUBLICATIONS

Scherzer, O., "The Theoretical Resolution Limit of the Electron Microscope", Journal of Applied Physics, vol. 20, (Jan. 1949), pp. 20-29.

*Primary Examiner*—Jack I. Berman
*Assistant Examiner*—Andrew Smyth
(74) *Attorney, Agent, or Firm*—Reed Smith LLP; Stanley P. Fisher, Esq.; Juan Carlos A. Marquez, Esq.

(57) ABSTRACT

A transmission electron microscope has a means for inputting a spatial size or distance d desired to be observed by the operator, calculates high contrast of an image based on this value and an observing condition which can reduce the influence of a false image superimposed, and desirably modulates an accelerating voltage of the electron microscope based thereon.

3 Claims, 11 Drawing Sheets

AFTER MODULATION
($\Delta I/I = 5 \times 10^{-6}$)

BEFORE MODULATION
($\Delta I/I = 2 \times 10^{-6}$)

ATOMIC POSITIONS
(○: ATOM)
0.24nm

TRANSMISSION ELECTRON MICROSCOPE

CLAIM OF PRIORITY

The present application claims priority from Japanese application JP 2005-136803 filed on May 10, 2005, the content of which is hereby incorporated by reference into this application.

BACKGROUND OF THE INVENTION

1. Field of the Invention

The present invention relates to a transmission electron microscope. In particular, the present invention relates to a transmission electron microscope and an image observing method using the same. More specifically, the present invention relates to an observing method which improves the quality of an electron microscope image obtained by a transmission electron microscope having a highly bright and coherent electron source.

2. Description of the Related Art

A transmission electron microscope which is a device illuminating a sample by an electron beam and forming a magnified image by electron lenses with a transmitted electron beam, enables us to directly observe fine structures in the sample. The transmission electron microscope now has an atomic level spatial resolution and has become one of standard measuring instruments in nanotechnology. The transmission electron microscope is also an essential device for analyzing the fine structure of various materials in various fields in the science and the industry; not only in the material science (including semiconductors and metals) but also in the medical and biological research fields. In recent years, the field emission electron guns (FEGs) which provide extremely bright and coherent electron beam are becoming available. Expectation for electron microscopes equipped with FEG has been increased as a means for analyzing and evaluating fine structures from order of microns to atomic scale.

FIG. 1 schematically shows a standard electron optical diagram of a general transmission electron microscope. An electron beam emitted from an electron source 1 is adjusted to have preferable brightness and divergence angle by an illuminating lens 2 and illuminate a sample 3. The transmitted and scattered electron beams 4 transmitted from the sample 3 are incident on an objective lens 5 and selected by an objective aperture 7 located at the back focal plane 6 of the objective lens 5. A magnified image is formed on an objective lens image plane 8. This image is finally magnified to a degree of ten thousand times to million times by an enlarging lenses 9 placed at the later stage and projected on a screen 10. The operator observes this image.

FIG. 2 shows electron optical diagram around the objective lens 5 when the sample can be regarded as a weak phase object (thickness of a sample is sufficiently small that only the electron's phase changes while the its intensity is unchanged after transmitting the sample). When a wavelength of an incident electron beam 11 is λ and a size of the structure in the sample 3 to be observed by the operator is d (namely, selected spatial frequency is 1/d), the scattered wave 4 is emerged from the lower surface of the sample having a scattering angle α=λ/d 12 for an optical axis, and incident on the objective lens 5. If the objective lens cause no spherical aberration, the scattering beam 4 passes through a path indicated by a solid line 13 at the rear of the objective lens 5 to reach to position 14 in the image plane 8. With the influence of the spherical aberration, the scattered wave 4 incident on the objective lens 5 deflected by an extra lens effect due to the spherical aberration. As a result, the electron beam path is shifted from the solid line 13 to a solid line 15 and reaches to a position 16 in the image plane 8. In this case, it is imaged on a position different from the original position in the sample. A position deviation amount 18 obtained by converting a spatial position deviation amount 17 on the image plane 8 to the sample plane gives ambiguity of position information of the image obtained in the device. Since a superimposed image is formed, image interpretation is complicated.

The electron beam influenced by the spherical aberration indicated by the solid line 15 causes an optical path difference 19 (=χ(d)) expressed by Equation 9 using a spherical aberration coefficient Cs and a defocus amount Δf (the insufficient focal state is positive) of the objective lens.

$$\chi(d) = \frac{1}{4} \cdot Cs \cdot \left(\frac{\lambda}{d}\right)^4 - \frac{1}{2} \cdot \Delta f \cdot \left(\frac{\lambda}{d}\right)^2 \quad \text{[Equation 9]}$$

Where χ(d) is an optical path difference, Cs is a spherical aberration coefficient of an objective lens, λ is a wavelength of an electron beam, d is size of the structure to be observed, and Δf is a defocus length for an objective lens.

When one divides optical path difference 19 by the λ and multiply by 2π, one gets the phase of electron beam. Sine function of this phase, i.e. Equation 10 is called an aberration function of the objective lens. The chart in FIG. 3 shows the example of the aberration function.

$$\sin\left[\frac{2\pi}{\lambda} \cdot \chi(d)\right] \quad \text{[Equation 10]}$$

This function indicates the contrast relative to the background when the transmitted electron beam, which is in parallel with the optical axis passing through the lens center, and the scattered beam are interfered to form an image on the image plane. When the relative contrast is positive, the image is light. When the relative contrast is negative, the image is dark.

The phase contrast transfer function (PCTF) is obtained by multiplying an aberration function of Equation 11 by an envelop function Ed (Δ, d) dependent on a focal length variation Δ of the objective lens shown in Equation 12 and FIG. 4 and an envelop function Ej (β, Δf, d) dependent on a divergence angle β of the electron beam applied on the sample and the defocus length Δf of the objective lens shown in Equation 13 and FIG. 5. Actually, the PCTF generally exhibits the resolution performance of the electron microscope to the spatial frequency 1/d (Equation 14 and FIG. 6).

$$\sin\left[\frac{2\pi}{\lambda} \cdot \chi(d)\right] \quad \text{[Equation 11]}$$

$$E_d(\Delta, d) = \exp\left[-\frac{\pi^2 \cdot \Delta^2 \cdot \lambda^2}{4d^4}\right] \quad \text{[Equation 12]}$$

where Ed (Δ, d) is an envelop function caused by a focal length variation Δ of an objective lens, Δ is a focal length variation of an objective lens, λ is a wavelength of an electron beam, and d is a distance or spatial size between any two selected points.

$$E_j(\beta, \Delta f, d) = \exp\left[-\frac{\pi^2 \cdot \beta^2 (Cs \cdot \lambda^2 - d^2 \cdot \Delta f)^2}{d^6}\right]$$ [Equation 13]

where Ej (β, Δf, d) is an envelop function due to the beam divergence of an incident electron, β is a divergence angle of the beam, λ is a wavelength of the electron beam, d is a distance or spatial size between any two selected points, and Δf is a defocus amount of an objective lens.

$$PCTF = \mathrm{Sin}\left[\frac{2\pi}{\lambda} \cdot \chi(d)\right] \cdot E_d(\Delta, d) \cdot E_j(\beta, \Delta f, d)$$ [Equation 14]

The focal length variation of an objective lens Δ is expressed by Equation 15 using a chromatic aberration coefficient Cc of the electron microscope, an accelerating voltage stability ΔV/V, an objective lens exciting current stability ΔI/I, and a spread of energy ΔE in an electron beam to an accelerating voltage V.

$$\Delta = Cc\sqrt{\left(\frac{\Delta V}{V}\right)^2 + \left(\frac{2\Delta I}{I}\right)^2 + \left(\frac{\Delta E}{V}\right)^2}$$ [Equation 15]

where Δ is a focal length variation of an objective lens, Cc is a chromatic aberration coefficient of an objective lens, ΔV/V is an accelerating voltage stability, ΔI/I is an objective lens current stability, and ΔE/V is a spread of energy in an electron beam to an accelerating voltage V.

A theoretical resolution which is also called a Scherzer resolution (see O. Sherzer, Journal of Applied Physics 20 (1949) p20) $d_{lim}$ of the electron microscope is defined by Equation 16 using the wavelength λ of the electron beam and the spherical aberration coefficient Cs.

$$d_{lim} = 0.66 \cdot Cs^{0.25} \cdot \lambda^{20.75}$$ [Equation 16]

where $d_{lim}$ is the Scherzer resolution, Cs is a spherical aberration coefficient of an objective lens, and λ is a wavelength of an electron beam.

A defocus amount $\Delta f_{sh}$ of the objective lens to achieve the Scherzer resolution is called a Scherzer focus and is a defocus amount generally providing the highest performance of the device.

When the focal length variation Δ of the objective lens is relatively large as usual with the thermal emission electron beam, the beam coherence is low and PCTF at Scherzer focus will has the shape as shown in a graph of FIG. 7. In this case, PCTF is rapidly attenuated with increase in the spatial frequency 1/d corresponding to the attenuations of both the envelop functions Ed (Δ, d) and Ej (β, Δf, d), becomes so small at the spatial frequency 1/d0 where the PCTF crosses 0 for the first time and later. Therefore it is difficult to obtain information small than the size d0.

On the other hand, when we use the field emission electron beam having high coherency, PCTF at Scherzer focus becomes as shown in FIG. 8 and its attenuation is shifted to the higher spatial frequency side. Therefore information in the high spatial frequency component is contributed to form the image so as to obtain high resolution.

In the region of the spatial frequency 1/d0 and larger, the PCTF is largely oscillated between positive and negative values to the slight change of the spatial frequency. In particular, the positive peak at the spatial frequency $1/d_{inv}$ indicates that the scattered beams in this peak have an influence on the image with considerable amplitude and incorrect (reversed) phase. Because of the spherical aberration of the objective lens, the scattered electron beams reach at the image plane with some displacement from the correct position, and cause inaccuracy in the image. This is so-called a false image effect. To avoid this effect, we conventionally use an objective aperture to block the scattered electron beam with larger spatial frequency than 1/d0.

SUMMARY OF THE INVENTION

FIG. 9 is a flowchart of a series of operations in electron microscope observation. When an object to be observed is determined, the operator has to choose the proper combination of the defocus of an objective lens and the diameter of an objective aperture (loop (1)) to observe and photograph appropriate images. To select these parameters, the operator must consider the size of the object to be observed. Nevertheless the image interpretations are difficult due to the false image effect, and often depend on the technical skill of the operator.

In recent years, the electron beam quality, especially in coherence, and the resolution of an electron microscope are remarkably improved owing to the advancement of an electron source and power supplies. To use such electron microscopes with highly coherent electron beam, the operator has to consider more severely the false image effect to interpret the image. As far as using rotationally-symmetric magnetic field electron lenses, which are generally used in conventional electron microscopes, the influence of a spherical aberration can not be removed in principle. This problem is an important factor to limit the performance and the usability of the electron microscope.

An objective aperture has been used as a solving means of these, in particular, as a means for preventing a false image effect. The objective aperture of the electron microscope having plural holes holed in a metal plate by precision machining or electrolytic polishing is used so that the holes inevitably have discrete diameters. There is not always a hole diameter which can block any phase inversion component. Even valid information can be blocked or unnecessary information cannot be prevented from being obtained.

Known examples of a means for reducing the false image effect include a method of providing more aperture holes (see Japanese Patent Application Laid-Open No. 5•217536) and a method of eliminating or lowering the coherence of an incident electron beam (see Japanese Patent Application Laid-Open No. 2003-229085). In the former, the diameters and shapes of individual holes are required to have high accuracy and the inserted location of the objective aperture is spatially limited. In the latter, as a means, improvement is easy and the merit of the field emission electron gun can be left, but to what degree the coherence is lowered is dependent on the electron microscope operator.

In addition to these problems, with the characteristic peculiar to an electron microscope image in which a image contrast is largely changed due to the slight change of the defocus amount Δf of the objective lens, in spite of the large required field, at present, the electron microscope is not always a device familiar to researchers due to difficulty of image interpretation.

An object of the present invention is to provide a usable electron microscope which can reduce time required for observing condition setting in operation in the range from an unskilled to skilled person operating the electron microscope and obtain an electron microscope image in which image interpretation is easy and precise.

As an overall construction, an electron microscope has, in addition to an electron microscope main body, an inputting device for inputting a distance or spatial size d between any two points desired to be observed by an operator, and a calculating device for calculating a defocus amount Δfc of an objective lens in which contrast of an image corresponding to d is high and PCTF reducing a false image effect, and is provided with a function of showing the calculated PCTFs as plural candidates to the operator, and a means for automatically or manually selecting the PCTF whose phase inversion component has a relatively small intensity from these PCTFs. When one of the shown PCTFs is selected, a modulating signal (ΔV, ΔI, ΔId) for achieving reduction of the false image effect caused by the phase inversion component is calculated and a modulating signal based on the calculated result is generated by a modulator separated from the electron microscope body. A controller controls the entire electron microscope and also has a function of superimposing these generated modulating signals on an output of a high voltage power source, an objective lens power source, or a deflection coil power source in order to realize the modulating state. These systems are constructed and utilized to solve the above problems.

According to an embodiment of the present invention, when only the distance or spatial size d between any two points desired to be observed by the operator is known, a defocus amount of an objective lens achieving an electron microscope image based on this value at a high contrast can be automatically calculated and an observing condition for reducing or removing a false image effect caused by the spherical aberration of the objective lens can be semi-automatically set. Time spent on an image interpretation or a selecting operation of an objective aperture hole according to a specified spatial frequency desired to be noted, which has been the problem of the related art electron microscope observation experiment can be largely reduced. The related art method in which objective aperture holes have discrete hole diameters is limited to an object to be observed dimensioned closely to a discrete specified size corresponding to the hole diameter. The embodiment of the present invention needs not to be limited in this point and one electron microscope can cope with an object to be observed in a wide range.

BRIEF DESCRIPTION OF THE DRAWINGS

FIGS. 15A, 15B, and 15C are diagrams comparing the effects of the present invention using a simulation image of a thin film crystal having an interatomic distance of 0.24 nm, in which FIG. 15A shows atomic positions and FIGS. 15B and 15C show simulation images before and after modulation.

DESCRIPTION OF THE PREFERRED EMBODIMENT

Figure 1:
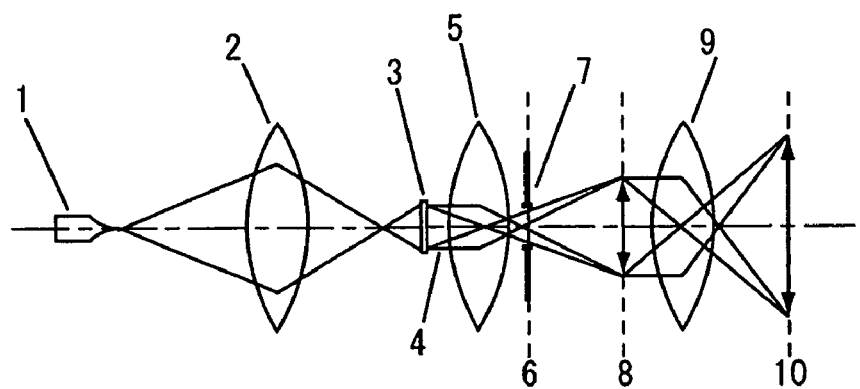
FIG. 1 is a diagram showing an electron optical system of a general transmission electron microscope.
Figure 2:
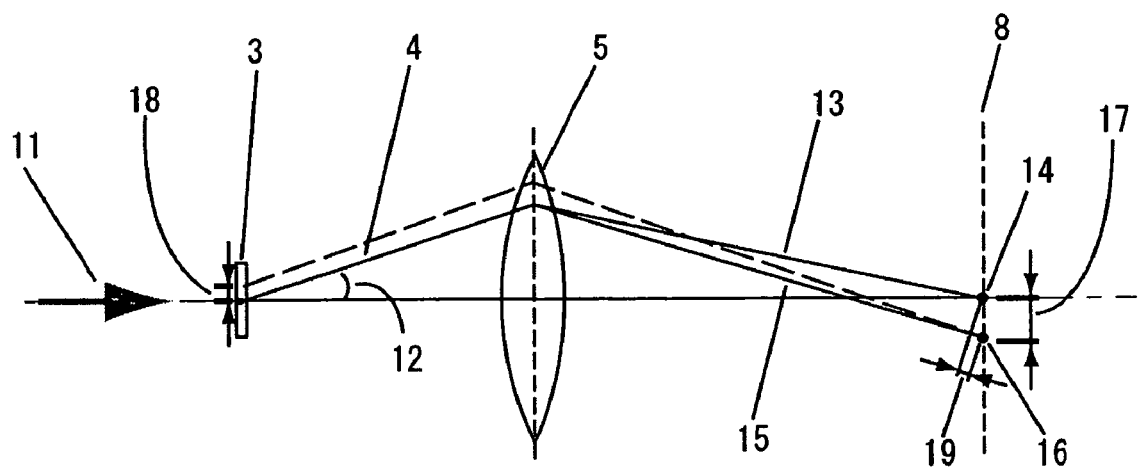
FIG. 2 is an enlarged view of a sample and the periphery of an objective lens of FIG. 1.
Figure 3:
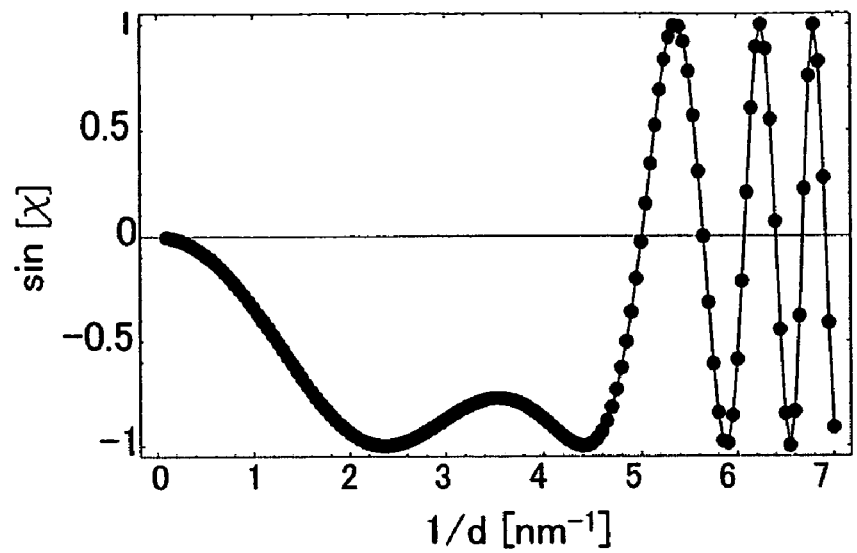
FIG. 3 is an example showing an aberration function of an objective lens.
Figure 4:
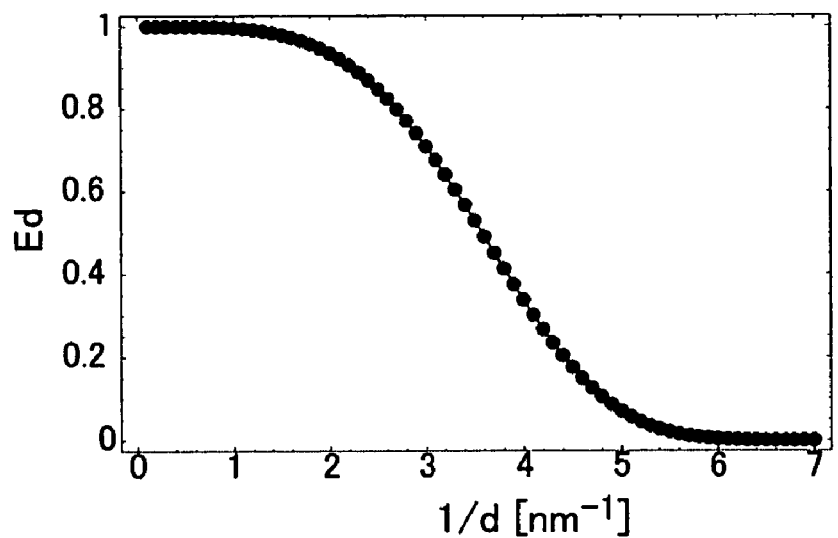
FIG. 4 is an example showing an envelop function Ed.
Figure 5:
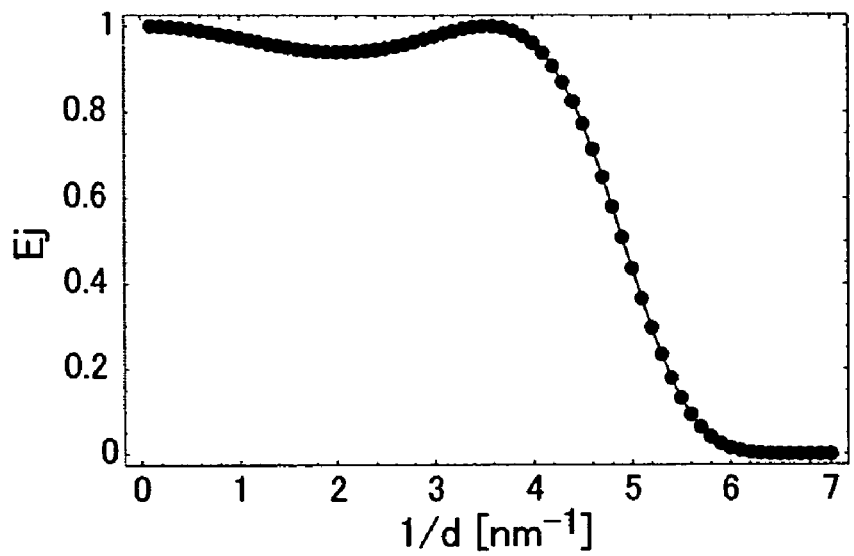
FIG. 5 is an example showing an envelop function Ej.
Figure 6:
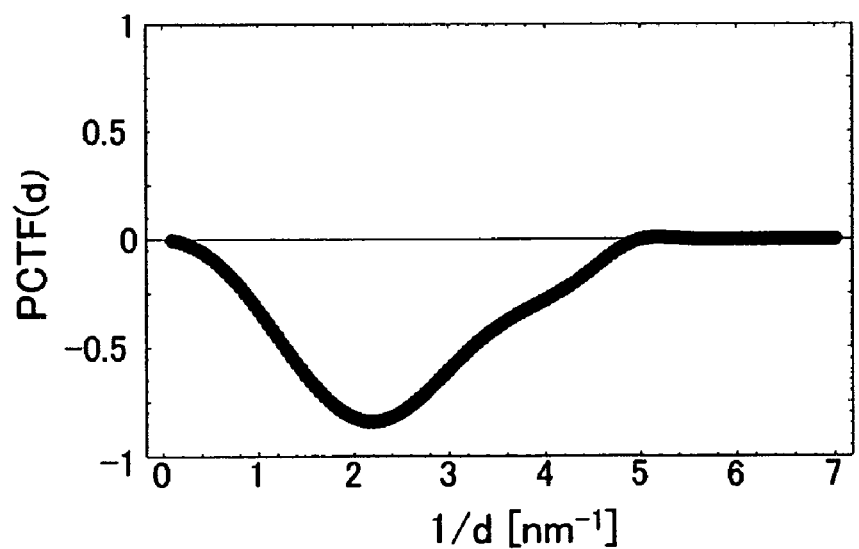
FIG. 6 is a graph showing the result (phase contrast transfer function) obtained by multiplying the aberration function of the objective lens shown in FIG. 3 by the envelop function E shown in FIG. 4 and the envelop function Ej shown in FIG. 5.
Figure 7:
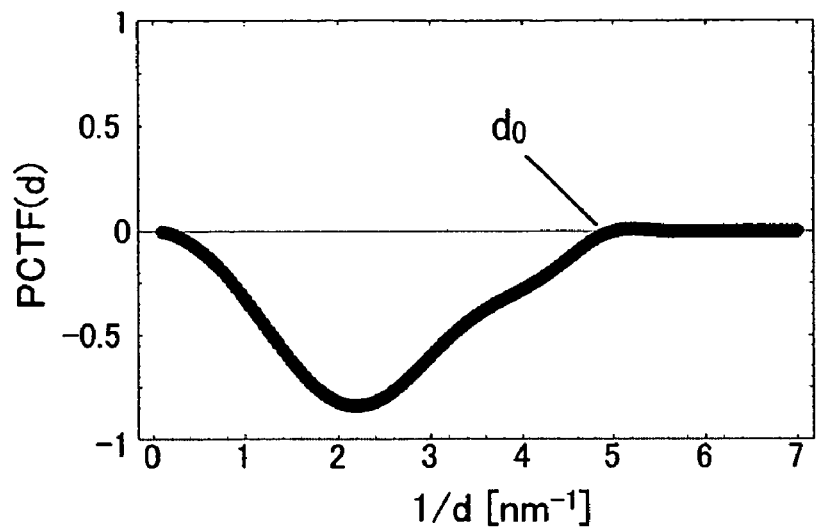
FIG. 7 is an example showing a phase contrast transfer function of a transmission electron microscope using a thermal electron source.
Figure 8:
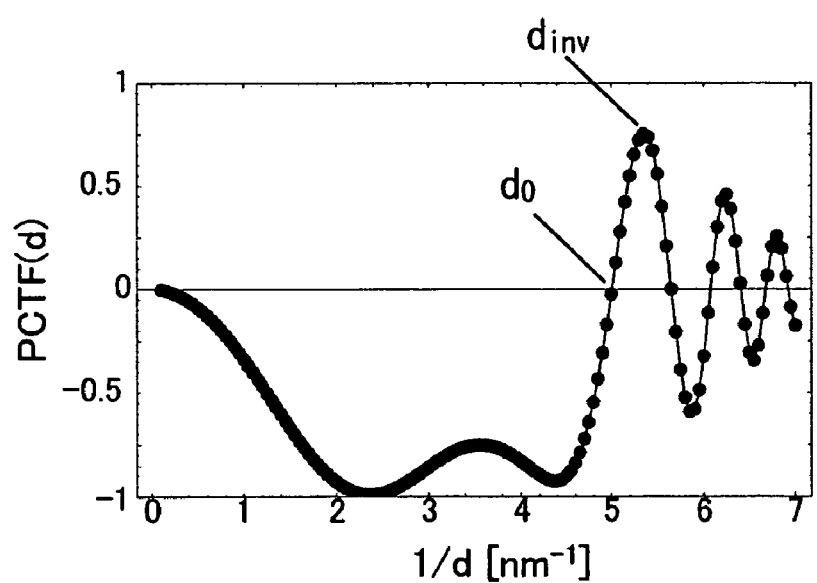
FIG. 8 is an example showing a phase contrast transfer function of a transmission electron microscope using a field emission electron source.
Figure 9:
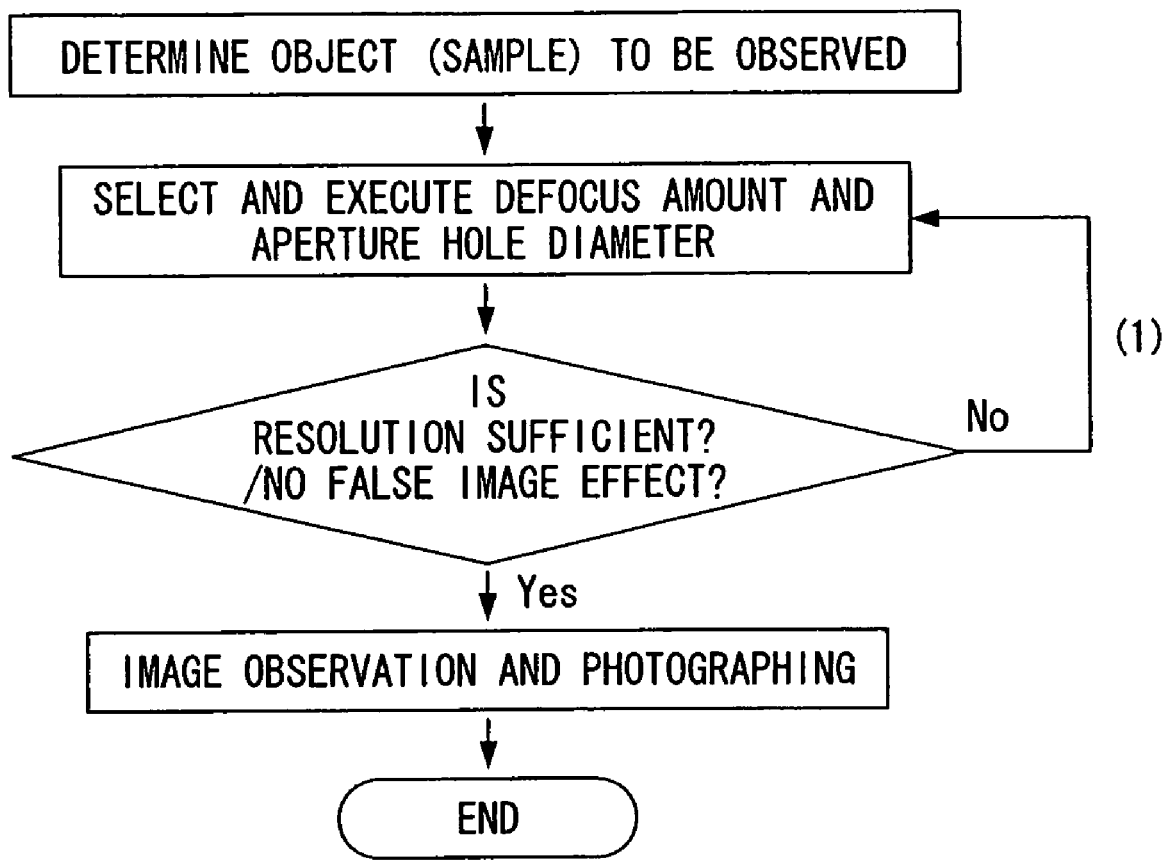
FIG. 9 is an operation flowchart of related art transmission electron microscope observation.
Figure 10:
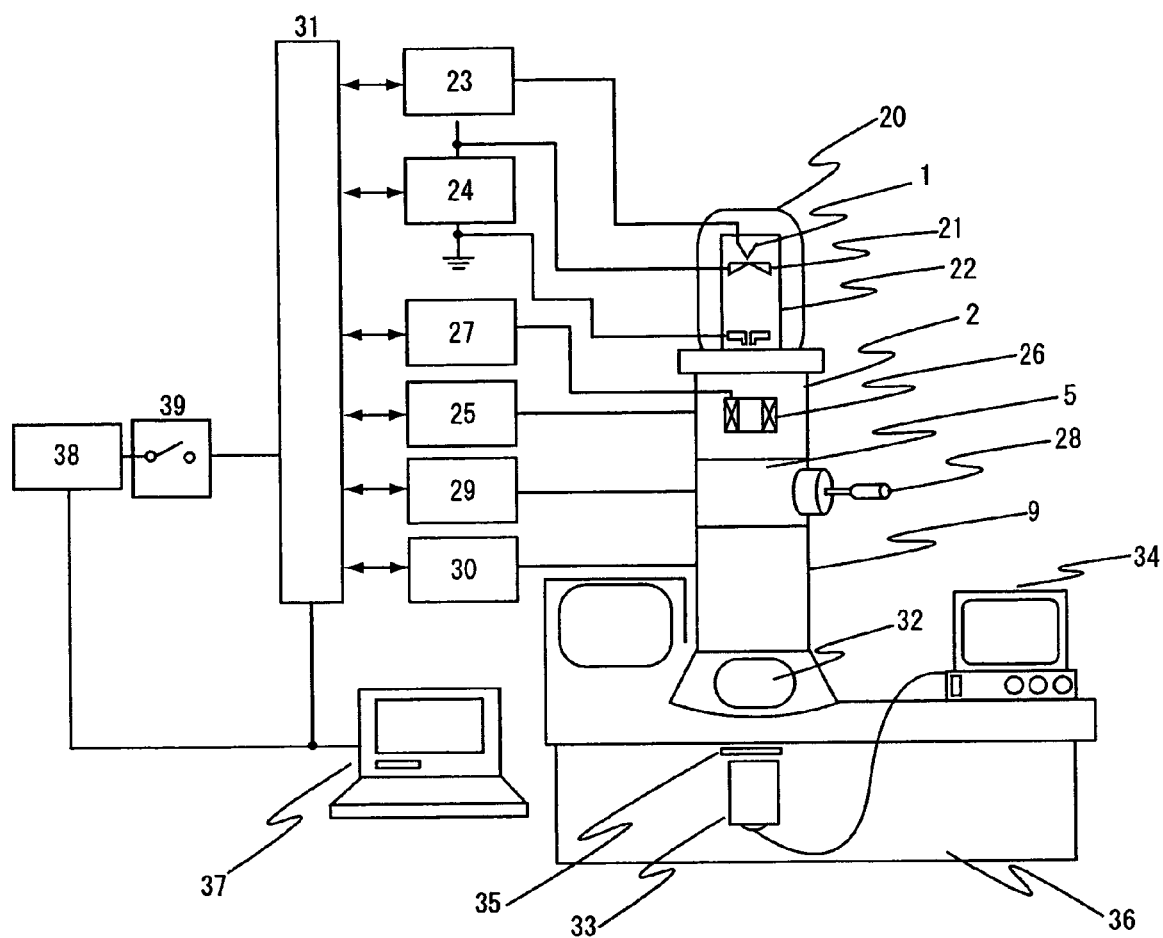
FIG. 10 is a diagram showing the overview of a transmission electron microscope embodying the present invention.

FIG. 10 shows the overview of a device embodying the present invention. An electron gun 20 has an electron source 1 constructed of a needle-like tungsten single crystal whose edge is sharpened, an extractor electrode 21 placed in a position opposite thereto, and an acceleration tube 22 for accelerating an extracted electron. A high voltage can be applied to the extractor electrode 21 by an extractor power source 23 provided externally and electrons can be extracted by applying a voltage of about −3.0 to −2.5 kV between the extractor electrode 21 and the electron source 1.

An accelerating voltage for accelerating an extracted electron is supplied to the acceleration tube 22 by an accelerating voltage source 24. An electron beam emerged from the electron gun 20 is set to a desired illuminating condition by an illumination lens 2 supplied with an exciting current from an illumination lens power source 25. An output of a deflection coil power source 27 supplying an electric current to a deflection coil 26 is adjusted. The optical axis of the incident electron beam and the lens axis (optical axis) of an objective lens 5 are adjusted to be matched so that the electron beam is incident on the sample.

The sample to be observed is held on the edge of a sample holder 28 and is placed immediately above the objective lens 5, which is not shown here. The electron beam incident on the sample which is then transmitted and scattered is imaged by the objective lens 5 supplied with an exciting current from an objective lens power source 29. This image is enlarged by an enlarging lens 9 supplied with an exiting current from an enlarging lens power source 30 placed at the rear of the objective lens 5. The power sources of the respective parts constructing the electron microscope are all connected to a integrate control unit 31 and outputs are monitored and controlled at all times.

Finally, the operator observes the image enlarged by the optical system directly from an observing window 32 or an image photographed by a television camera 33 via a television monitor 34. These images can be recorded using a photographing film 35. The above construction is a basic electron microscope body 36. In addition to the basic construction, the present invention is provided with an inputting and calculating device 37 unifying together an inputting device for inputting the distance or spatial size d between any two points desired to be observed by the operator and a calculating device for calculating each function using the parameter of the device side and the input value d, a modulator 38 generating a modulating voltage or a modulating current based on the transferred calculated result, and a switch 39 for electrically isolating the modulator 38 from the controller 31 and turning on and off a signal generated by the modulator 38.

Figure 11:
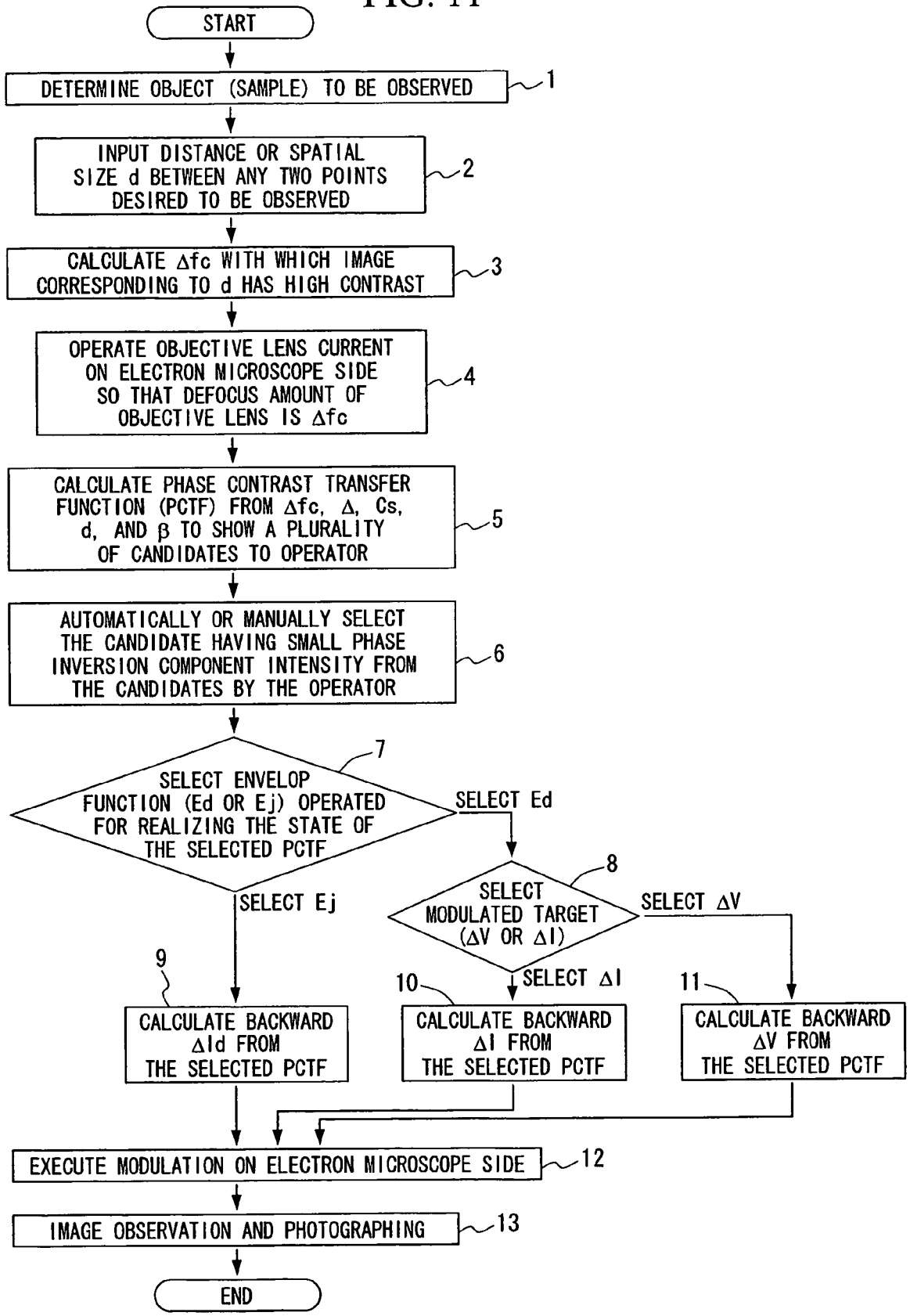
FIG. 11 is an operation flowchart of transmission electron microscope observation embodying the present invention.

The operation flow along the embodiment of the present invention is shown in the flowchart of FIG. 11. When a sample to be observed is determined and the distance or spatial size d between any two points desired to be observed by the operator (or the spatial frequency 1/d may be used) is input via the inputting and calculating device 37, the inputting and calculating device 37 calculates the defocus amount $\Delta fc$ of the objective lens 5 based on Equation 17.

$$\Delta f_c(d) = \frac{1}{2}\left(Cs \cdot \frac{\lambda^2}{d^2} + \frac{d^2}{\lambda}\right)$$ [Equation 17]

where $\Delta fc$ is a defocus amount of an objective lens giving high contrast to an input value d, Cs is a spherical aberration coefficient of an objective lens, $\lambda$ is a wavelength of an electron beam, and d is a distance or spatial size between any two selected points.

It should be noted that the value d to be input is a value $(d>d_{lim})$ larger than the theoretical resolution $d_{lim}$ of the device. The input d is an interatomic distance or a lattice plane distance for a crystal sample, and the size of a tissue section and the size of a particulate substance of hemoglobin included in erythrocyte for a biological slice sample.

The calculated defocus amount $\Delta fc$ is a defocus amount of the objective lens in which the value corresponding to the spatial frequency 1/d on the insufficient focal side of the aberration function of Equation 18 is "−1" for the first time. In other words, this value is a defocus amount in which PCTF(d) corresponding to the spatial frequency 1/d has a maximum value.

$$\text{Sin}\left[\frac{2\pi}{\lambda} \cdot \chi(d)\right]$$ [Equation 18]

The integrate control unit 31 to which the calculated result is transferred from the inputting and calculating device 37 operates the objective lens power source 29 to adjust an objective lens current value so that the defocus amount $\Delta fc$ of the objective lens 5 is a value obtained by the above Equation 17.

The operation of covering and selecting the defocus amount of the objective lens while observing the observed image can be simplified.

Thus, the defocus amount $\Delta fc$ of the objective lens is known and the spherical aberration coefficient Cs is also known. PCTF using the focal length variation of the objective lens $\Delta$ or the divergence angle of the incident electron beam $\beta$ as a parameter can be calculated. Here, PCTF before being modulated is calculated, the envelop functions Ed ($\Delta$, d) and Ej ($\beta$, $\Delta f$, d) are operated so that the intensity of the phase inversion component of the PCTF is sufficiently small, and the obtained plural new PCTFs are shown as candidates of the observing recommendation condition to the operator. Specifically, contrast intensity PCTF ($d_{inv}$) of the phase inversion component of the PCTF before being modulated and the spatial frequency $1/d_{inv}$ corresponding to this value are determined. The focal length variation of the objective lens $\Delta$ of the envelop function Ed ($\Delta$, d) or the divergence angle $\beta$ of the incident electron beam of Ej ($\beta$, $\Delta f$, d) which attenuates the contrast intensity PCTF ($d_{inv}$) from 0.1 to 0.2 times is calculated backward. The obtained plural new PCTFs are shown as candidates. The value from 0.1 times to 0.2 times is an experience value obtained from imaging simulation and experiment result by the present inventors. The candidates of the plural PCTFs are preferably in the range in which the influence on the electron microscope by the phase inversion component can be substantially neglected, which is not limited thereto. The influence is preferably sufficiently small and the phase inversion component is preferably smaller.

The operator manually selects the specified one of the shown PCTFs (the reference numeral 6 of FIG. 11). This operation can also automatically select PCTF having a relatively small contrast intensity PCTF($d_{inv}$) of the phase inversion component by the inputting and calculating device 37. Upon determination of the selected specified PCTF, the device side executes any one of the following three operations.

When selecting the attenuation operation of the envelop function Ed ($\Delta$, d) (when branched from the reference numeral 7 of FIG. 11 to the right side), the focal length variation $\Delta$ of the objective lens 5 is a parameter. The focal length variation of an objective lens $\Delta$ is changed in engagement with both the accelerating voltage stability $\Delta V/V$ and the objective lens current stability $\Delta I/I$. The operator further selects any one of outputs of the accelerating voltage source 24 and the objective lens power source 29 as a modulated target. Both the $\Delta V/V$ and $\Delta I/I$ may be changed.

When selecting the output of the accelerating voltage source 24 as a modulated target (when branched from the reference numeral 8 of FIG. 11 to the right side), the contrast intensity PCTF ($d_{inv}$) of the selected PCTF, the spatial frequency $d_{inv}$, and a proportionality constant 19 are used to calculate a value based on Equation 20 by the inputting and calculating device 37 to transfer this value to the integlate control unit 31 and the modulator 38.

$$0.1 \leq k \leq 0.2$$ [Equation 19]

$$\Delta V = V\left\{\sqrt{\frac{-4 \cdot \ln[k \cdot PCTF(d_{inv})] \cdot d_{inv}^4}{\pi^2 \cdot Cc^2 \cdot \lambda^2} - \left(\frac{2\Delta I}{I}\right)^2 - \left(\frac{\Delta E}{V}\right)^2}\right\}$$ [Equation 20]

where $\Delta V$ is a modulating signal added to an accelerating voltage, V is an accelerating voltage, k is a proportionality constant, PCTF($d_{inv}$) is an intensity of a phase inversion component, $d_{inv}$ is a spatial frequency component giving a maximum phase inversion component, Cc is a chromatic aberration coefficient of an objective lens, $\lambda$ is a wavelength of an electron beam, $\Delta I/I$ is an objective lens current stability, and $\Delta E/V$ is a spread of energy in an electron beam to an accelerating voltage V.

Figure 12:
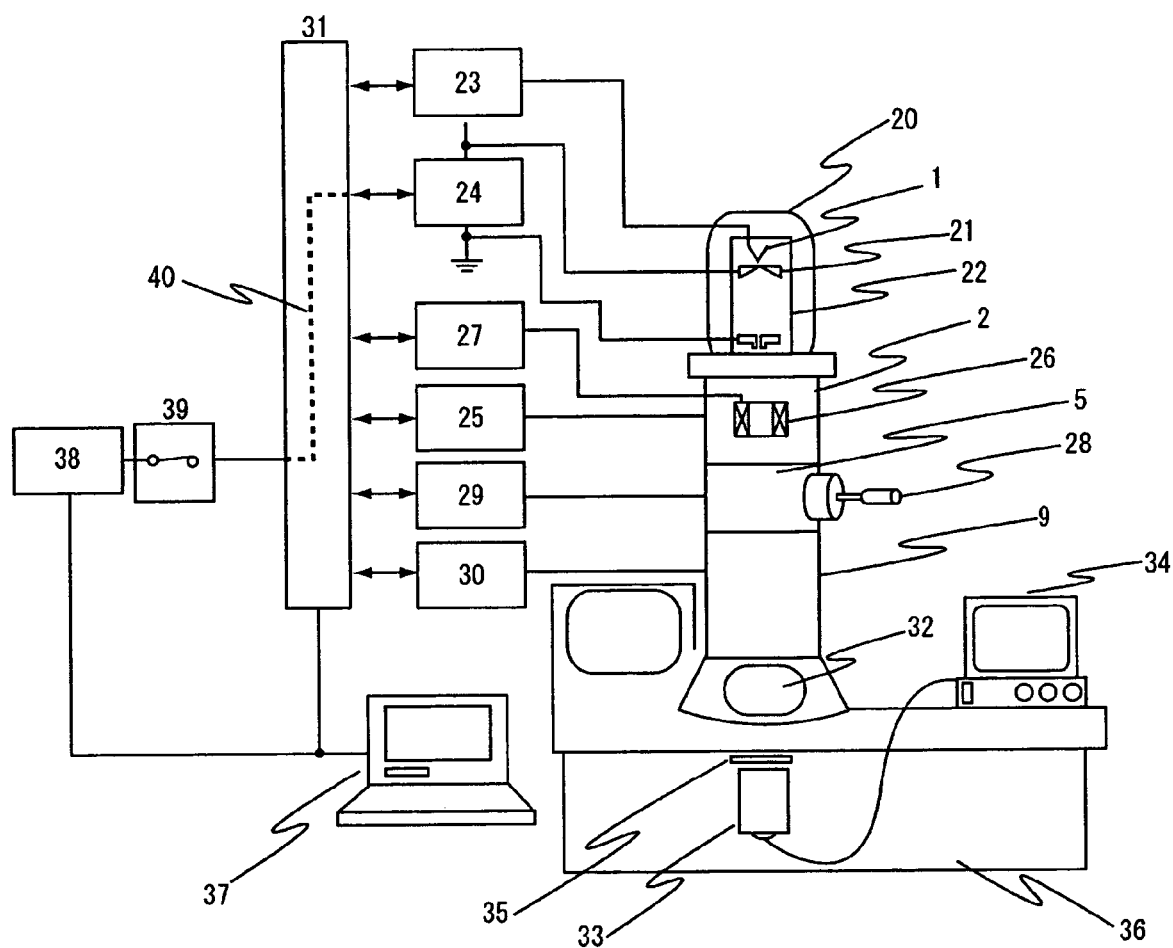
FIG. 12 is a diagram showing the overview of the transmission electron microscope when superimposing modulation on an accelerating voltage source output, as an embodiment of the present invention.

The modulator 38 generates a modulating signal 40 shown in FIG. 12 based on this value to transfer it to the integrate control unit 31 via the closed switch 39. The integrate control unit 31 operates the accelerating voltage source 24 so that the accelerating voltage output is modulated by ΔV.

FIG. 12 shows an embodiment in this case. The modulating signal 40 generated by the modulator 38 is transferred to the accelerating voltage source 24 so that the output of the accelerating voltage source 24 is modulated.

When selecting the output of the objective lens power source 29 as a modulated target (when branched from the reference numeral 8 of FIG. 11 to the lower side), the contrast intensity PCTF ($d_{inv}$) of the selected PCTF, the spatial frequency $d_{inv}$, and a proportionality constant 21 are used to calculate a value based on Equation 22 by the inputting and calculating device 37 to transfer this value to the integlate control unit 31 and the modulator 38.

$$0.1 \leq k \leq 0.2 \quad \text{[Equation 21]}$$

$$\Delta I = I \left\{ \frac{1}{2} \sqrt{\frac{-4 \cdot \ln[k \cdot PCTF(d_{inv})] \cdot d_{inv}^4}{\pi^2 \cdot Cc^2 \cdot \lambda^2} - \left(\frac{\Delta V}{V}\right)^2 - \left(\frac{\Delta E}{V}\right)^2} \right\} \quad \text{[Equation 22]}$$

where ΔV is a modulating signal added to an objective lens current, I is an objective lens current, k is a proportionality constant, PCTF($d_{inv}$) is an intensity of a phase inversion component, $d_{inv}$ is a spatial frequency component giving a maximum phase inversion component, Cc is a chromatic aberration coefficient of an objective lens, λ is a wavelength of an electron beam, ΔV/V is an accelerating voltage stability, and ΔE/V is a spread of energy in an electron beam to an accelerating voltage V.

The modulator 38 generates a modulating signal 41 based on this value to transfer it to the integlate control unit 31 via the closed switch 39. The integlate control unit 31 operates the output of the objective lens power source 29 so that the objective lens current is modulated by ΔI.

Figure 13:
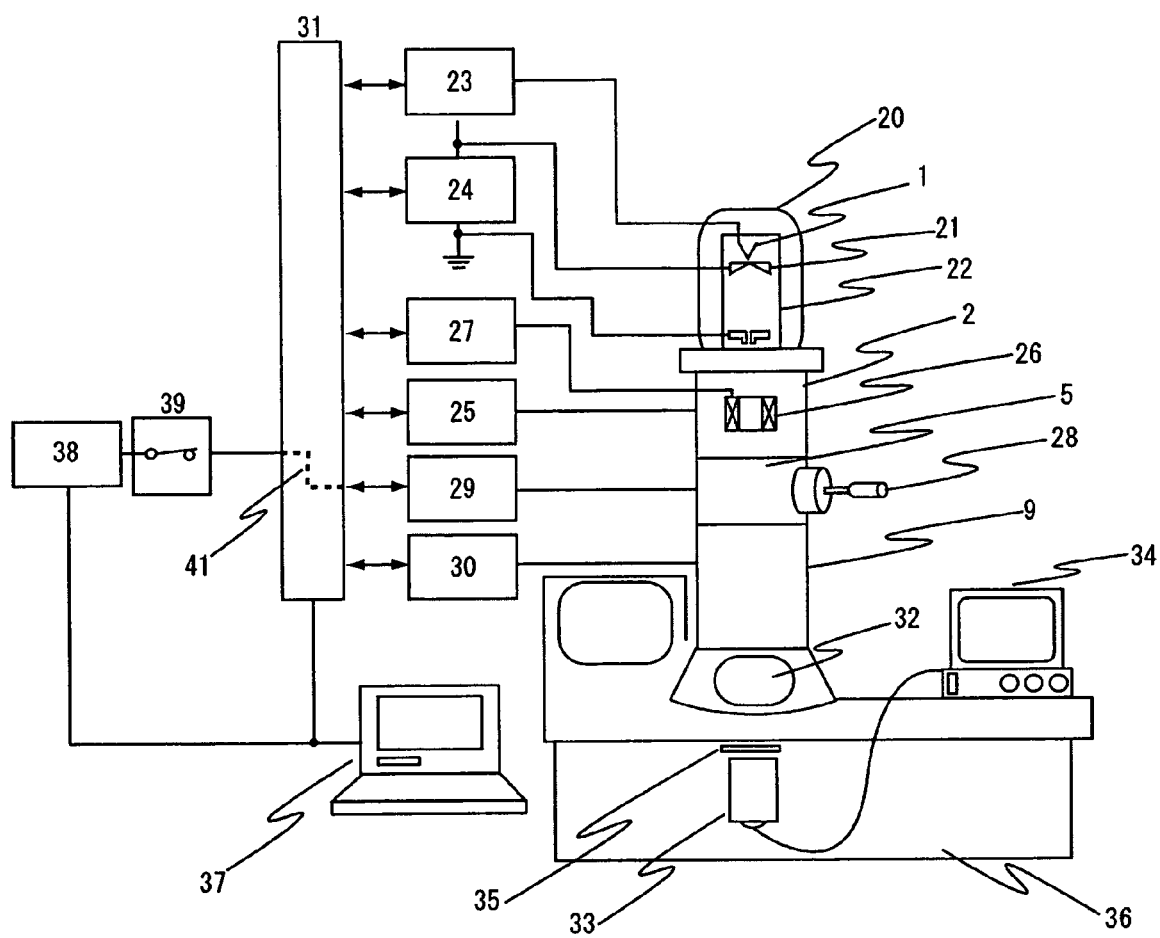
FIG. 13 is a diagram showing the overview of the transmission electron microscope when superimposing modulation on an objective lens power source output, as an embodiment of the present invention.

FIG. 13 shows an embodiment in this case. The modulating signal 41 generated by the modulator 38 is transferred to the objective lens power source 29 so that the output of the objective lens power source 29 is modulated.

When selecting the attenuation operation of the envelop function Ej (β, Δf, d) (when branched from the reference numeral 7 of FIG. 11 to the lower side), the divergence angle β of the electron beam applied on the sample is a parameter. Actually, the modulating current (ΔId) added to an output of the deflection coil power source 27 is a parameter (the reference numeral 9 of FIG. 11).

In this case, the contrast intensity PCTF ($d_{inv}$) of the selected PCTF, the spatial frequency $d_{inv}$, and a proportionality constant 23 are used to calculate a value ΔId based on Equation 24 by the inputting and calculating device 37 to transfer this value to the integlate control unit 31 and the modulator 38.

$$0.1 \leq k \leq 0.2 \quad \text{[Equation 23]}$$

$$\Delta I_d = \frac{\sqrt{\frac{-d_{inv}^6 \cdot \ln[k \cdot PCTF(d_{inv})]}{\pi^2 \cdot (Cs \cdot \lambda^2 - d_{inv}^2 \cdot \Delta f_c)^2}}}{\xi} \quad \text{[Equation 24]}$$

where ΔId is a modulating signal added to a deflection coil current, $d_{inv}$ is a spatial frequency component giving a maximum phase inversion component, k is a proportionality constant, PCTF($d_{inv}$) is an intensity of a phase inversion component, Cs is a spherical aberration coefficient of an objective lens, λ is a wavelength of an electron beam, Δfc is a defocus amount of an objective lens giving high contrast to an input value d, and ξ is a deflection angle per unit current of a deflection coil.

The modulator 38 generates a modulating signal 42 based on this value to transfer it to the integlate control unit 31 via the closed switch 39. The integlate control unit 31 operates the output of the deflection coil power source 27 so that the deflection coil current is modulated.

Figure 14:
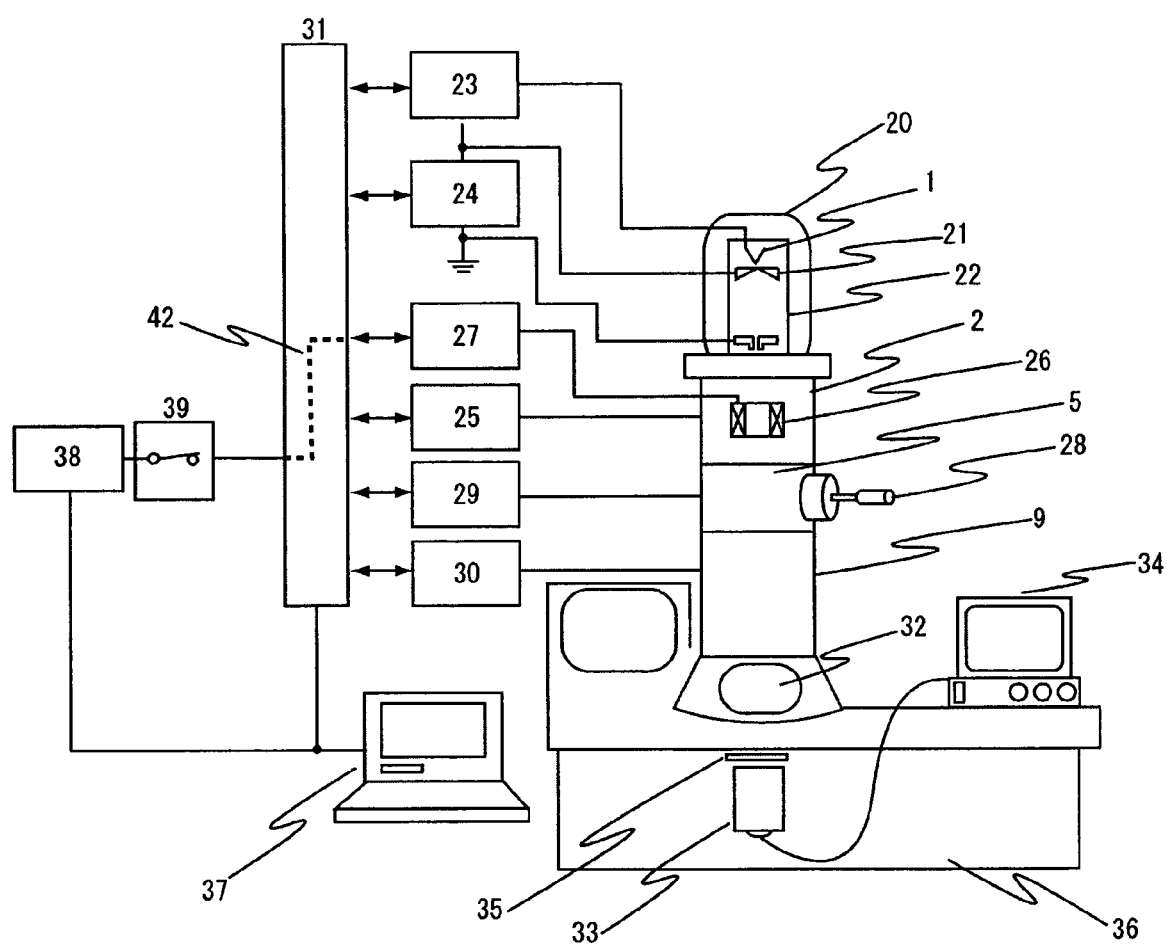
FIG. 14 is a diagram showing the overview of the transmission electron microscope when superimposing modulation on a deflection coil power source output, as an embodiment of the present invention.

FIG. 14 shows an embodiment in this case. The modulating signal 42 generated by the modulator 38 is transferred to the deflection coil power source 27 so that the output of the deflection coil power source 27 is modulated. After obtained these states, an image observing operation and a photographing operation are started.

The output (amplitude) itself of any of the three kinds of modulating signals is required to be stabilized at a high accuracy (to $10^{-6}$). An output waveform is preferably a triangle wave, a saw teeth wave, or a sine wave, which is not particularly limited unless the waveform causes overshoot by a load to disturb an amplitude. It may be a white noise modulating signal having plural spectra. A cycle is not particularly limited when at least one-cycle modulation can be given within an exposure time to the photographing film 35 or within a one-frame time (1/30 seconds) of the television monitor 34. When modulating the objective lens current or the deflection coil current, the upper limit of a response frequency is determined by inductance in the inside coil.

In a series of these processes, the observing condition setting operation including setting of a defocus amount of the objective lens and selection of an objective aperture which has been dependent on the skill of the operator can be semi-automated.

Figure 15:
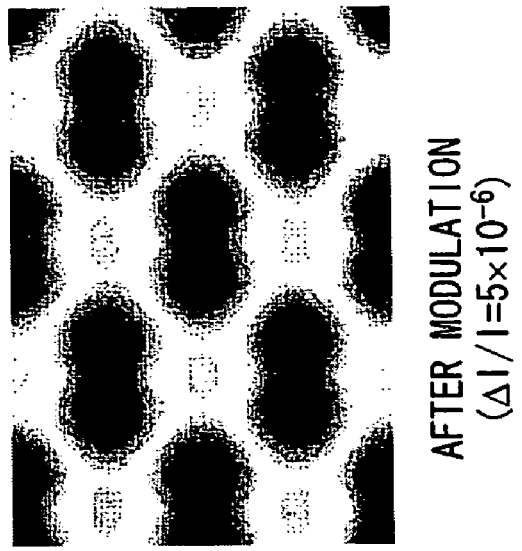
Figure 15:
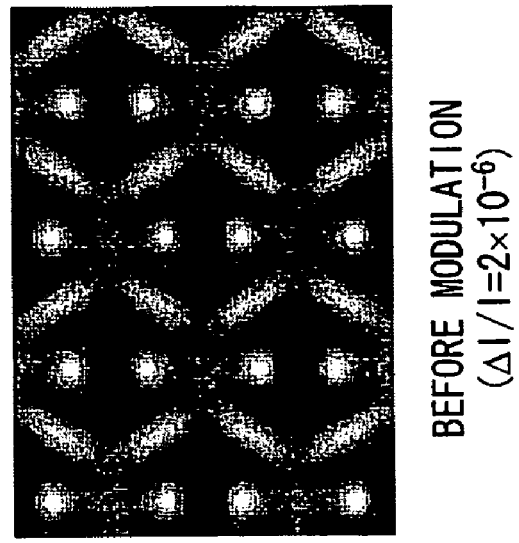
Figure 15:
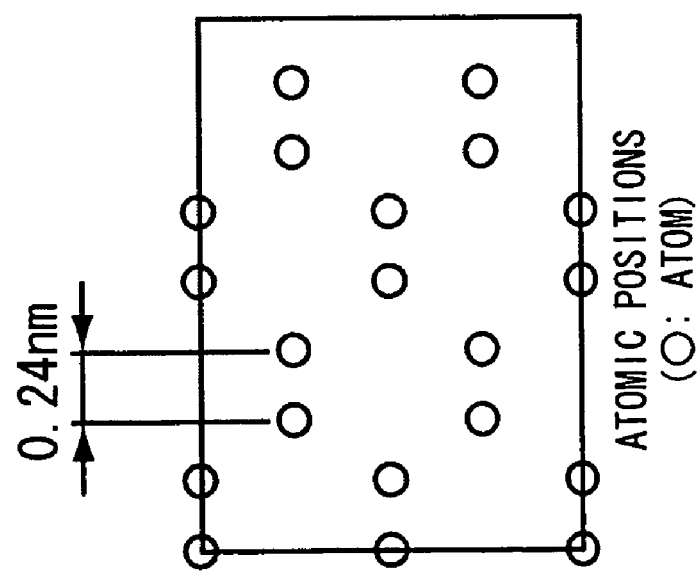

FIG. 15 shows an example inspecting the effect of the embodiment of the present invention using imaging simulation. In the calculating model, an accelerating voltage is 300 kV, an accelerating voltage stability ΔV/V is $2 \times 10^{-6}$, a spherical aberration coefficient Cs is 1.2 mm, a chromatic aberration coefficient Cc is 1.7 mm, a spread of energy in an electron beam is 0.3 eV, a sample film thickness is 1 nm, a divergence angle (half angle) of an illuminating electron beam is 0.1 mrad, and a spatial size d to be especially noted is 0.24 nm. The defocus amount of the objective lens is a value obtained from Equation 25 (Δfc=55 nm).

$$\Delta f_c(d) = \frac{1}{2}\left(Cs \cdot \frac{\lambda^2}{d^2} + \frac{d^2}{\lambda}\right) \quad \text{[Equation 25]}$$

where Δfc is a defocus amount of an objective lens giving high contrast to an input value d, Cs is a spherical aberration coefficient of an objective lens, λ is a wavelength of an electron beam, and d is a distance or spatial size between any two selected points.

Ed (Δ, d) is selected as an envelop function operated and an output of the objective lens power source is selected as a modulated target.

FIG. 15A shows atomic positions by o and an interatomic distance between two adjacent atoms (=0.24 nm) is equal to d. FIG. 15B shows a simulation image before modulation and the contrast (false image) except for the atomic positions is significant. FIG. 15C shows a simulation image when the proportionality constant k is 0.15, the modulating current ΔI is determined using Equation 26, and modulation with which the current stability ΔI/I becomes $5 \times 10^{-6}$ to the objective lens current is added.

$$\Delta I = \quad \text{[Equation 26]}$$

$$I \left\{ \frac{1}{2} \sqrt{\frac{-4 \cdot \ln[k \cdot PCTF(d_{inv})] \cdot d_{inv}^4}{\pi^2 \cdot Cc^2 \cdot \lambda^2} - \left(\frac{\Delta V}{V}\right)^2 - \left(\frac{\Delta E}{V}\right)^2} \right\}$$

where $\Delta I$ is a modulating signal added to an objective lens current, I is an objective lens current, k is a proportionality constant, $PCTF(d_{inv})$ is an intensity of a phase inversion component, $d_{inv}$ is a spatial frequency component giving a maximum phase inversion component, Cc is a chromatic aberration coefficient of an objective lens, $\lambda$ is a wavelength of an electron beam, $\Delta V/V$ is an accelerating voltage stability, and $\Delta E/V$ is a spread of energy in an electron beam to an accelerating voltage V.

Strictly speaking, the calculated result of Equation 26 is $\Delta I = 4.89 \times 10^{-6}$. In consideration of the stability of the power source actually manufactured, $\Delta I/I = 5 \times 10^{-6}$. Black contrasts exist in the atomic positions shown in FIG. 15A so that the adjacent individual atomic images can be discriminated. As compared with FIG. 15B, the influence of the false image is small and image interpretation is easy.

What is claimed is:

1. A transmission electron microscope comprising:
an electron source, an electron extractor electrode, an acceleration tube for accelerating an extracted electron,
an illumination lens for desirably adjusting an electron beam emerged from the acceleration tube, a sample holder for applying the electron beam from the illumination lens on a sample placed thereon, a deflection coil for deflecting the electron before being incident on the sample, an objective lens on which the electron beam transmitted through and scattered from the sample is incident,
an accelerating voltage source for controlling an accelerating voltage of the acceleration tube, an objective lens power source for controlling an objective lens current of the objective lens, a deflection coil power source for controlling a deflection coil current of the deflection coil, and
input means for inputting a distance or spatial size d between any two points of the sample desired to be observed,
wherein a defocus amount $\Delta fc$ of the objective lens based on Equation 1 is calculated, a focal length variation of an objective lens $\Delta$ of the objective lens expressed by Equation 2 or a divergence angle $\beta$ of an incident electron beam to the sample is a parameter, and plural phase contrast transfer functions (PCTFs) in the range in which the influence on an electron microscope image given by a phase inversion component can be substantially neglected is determined, $$\Delta f_c(d) = \frac{1}{2}\left(Cs \cdot \frac{\lambda^2}{d^2} + \frac{d^2}{\lambda}\right) \quad \text{[Equation 1]}$$

where $\Delta fc$ is a defocus amount of an objective lens giving high contrast to an input value d, Cs is a spherical aberration coefficient of an objective lens, $\lambda$ is a wavelength of an electron beam, and d is a distance or spatial size between any two selected points, $$\Delta = Cc\sqrt{\left(\frac{\Delta V}{V}\right)^2 + \left(\frac{2\Delta I}{I}\right)^2 + \left(\frac{\Delta E}{V}\right)^2} \quad \text{[Equation 2]}$$

where $\Delta$ is a focal length variation of an objective lens, Cc is a chromatic aberration coefficient of an objective lens, $\Delta V/V$ is an accelerating voltage stability, $\Delta I/I$ is an objective lens current stability, and $\Delta E/V$ is a spread of energy in an electron beam to an accelerating voltage V, wherein one of the determined functions PCTFs in which the phase inversion component is relatively small is selected, the state of the one selected function PCTF is realized by the electron microscope by using the focal length variation of an objective lens $\Delta$ as a parameter and modulating the accelerating voltage, and a modulated value $\Delta V$ added to the accelerating voltage source is determined by calculation of Equation 3, $$\Delta V = V\left\{\sqrt{\frac{-4 \cdot \ln[k \cdot PCTF(d_{inv})] \cdot d_{inv}^4}{\pi^2 \cdot Cc^2 \cdot \lambda^2} - \left(\frac{2\Delta I}{I}\right)^2 - \left(\frac{\Delta E}{V}\right)^2}\right\} \quad \text{[Equation 3]}$$

where $\Delta V$ is a modulating signal added to an accelerating voltage, V is an accelerating voltage, k is a proportionality constant, $PCTF(d_{inv})$ is an intensity of a phase inversion component before modulation, $d_{inv}$ is a spatial frequency component giving a maximum phase inversion component, Cc is a chromatic aberration coefficient of an objective lens, $\lambda$ is a wavelength of an electron beam, $\Delta I/I$ is an objective lens current stability, and $\Delta E/V$ is a spread of energy in an electron beam to an accelerating voltage V, (the proportionality constant k in Equation 3 is determined to be a value based on Equation 4)

$$0.1 \leq k \leq 0.2 \quad \text{[Equation 4]}$$

wherein the modulated value $\Delta V$ is superimposed on the accelerating voltage of the accelerating voltage source.

2. A transmission electron microscope comprising:
an electron source, an electron extractor electrode, an acceleration tube for accelerating an extracted electron,
an illumination lens for desirably adjusting an electron beam emerged from the acceleration tube, a sample holder for applying the electron beam from the illumination lens on a sample placed thereon, a deflection coil for deflecting the electron before being incident on the sample, an objective lens on which the electron beam transmitted through and scattered from the sample is incident,
an accelerating voltage source for controlling an accelerating voltage of the acceleration tube, an objective lens power source for controlling an objective lens current of the objective lens, a deflection coil power source for controlling a deflection coil current of the deflection coil, and
input means for inputting a distance or spatial size d between any two points of the sample desired to be observed,
wherein a defocus amount $\Delta fc$ of the objective lens based on Equation 1 is calculated, a focal length variation of an objective lens $\Delta$ of the objective lens expressed by Equation 2 or a divergence angle $\beta$ of an incident electron beam to the sample is a parameter, and plural phase contrast transfer functions (PCTFs) in the range in which the influence on an electron microscope image given by a phase inversion component can be substantially neglected is determined, $$\Delta f_c(d) = \frac{1}{2}\left(Cs \cdot \frac{\lambda^2}{d^2} + \frac{d^2}{\lambda}\right) \quad \text{[Equation 1]}$$

where Δfc is a defocus amount of an objective lens giving high contrast to an input value d, Cs is a spherical aberration coefficient of an objective lens, λ is a wavelength of an electron beam, and d is a distance or spatial size between any two selected points, $$\Delta = Cc\sqrt{\left(\frac{\Delta V}{V}\right)^2 + \left(\frac{2\Delta I}{I}\right)^2 + \left(\frac{\Delta E}{V}\right)^2} \quad \text{[Equation 2]}$$

where Δ is a focal length variation of an objective lens, Cc is a chromatic aberration coefficient of an objective lens, ΔV/V is an accelerating voltage stability, ΔI/I is an objective lens current stability, and ΔE/V is a spread of energy in an electron beam to an accelerating voltage V, wherein one of the determined functions PCTFs in which the phase inversion component is relatively small is selected, the state of the one selected function PCTF is realized by the electron microscope by using the focal length variation of an objective lens Δ as a parameter and modulating the objective lens current, and a modulated value ΔI added to the objective lens power source is determined by calculation of Equation 5, $$\Delta I = I \left\{ \frac{1}{2} \sqrt{ \frac{-4 \cdot \ln[k \cdot PCTF(d_{inv})] \cdot d_{inv}^4}{\pi^2 \cdot Cc^2 \cdot \lambda^2} - \left(\frac{\Delta V}{V}\right)^2 - \left(\frac{\Delta E}{V}\right)^2 } \right\} \quad \text{[Equation 5]}$$

where ΔI is a modulating signal added to an objective lens current, I is an objective lens current, k is a proportionality constant, $PCTF(d_{inv})$ is an intensity of a phase inversion component before modulation, $d_{inv}$ is a spatial frequency component giving a maximum phase inversion component, Cc is a chromatic aberration coefficient of an objective lens, λ is a wavelength of an electron beam, ΔV/V is an accelerating voltage stability, and ΔE/V is a spread of energy in an electron beam to an accelerating voltage V, (the proportionality constant k in Equation 5 is determined to be a value based on Equation 6)

$$0.1 \leq k \leq 0.2 \quad \text{[Equation 6]}$$

wherein the modulated value ΔI is superimposed on the objective lens current of the objective lens power source.

3. A transmission electron microscope comprising:

an electron source, an electron extractor electrode, an acceleration tube for accelerating an extracted electron, an illumination lens for desirably adjusting an electron beam emerged from the acceleration tube, a sample holder for applying the electron beam from the illumination lens on a sample placed thereon, a deflection coil for deflecting the electron before being incident on the sample, an objective lens on which the electron beam transmitted through and scattered from the sample is incident, an accelerating voltage source for controlling an accelerating voltage of the acceleration tube, an objective lens power source for controlling an objective lens current of the objective lens, a deflection coil power source for controlling a deflection coil current of the deflection coil, and input means for inputting a distance or spatial size d between any two points of the sample desired to be observed, wherein a defocus amount Δfc of the objective lens based on Equation 1 is calculated, a focal length variation of an objective lens Δ of the objective lens expressed by Equation 2 or a divergence angle β of an incident electron beam to the sample is a parameter, and plural phase contrast transfer functions (PCTFs) in the range in which the influence on an electron microscope image given by a phase inversion component can be substantially neglected is determined, $$\Delta f_c(d) = \frac{1}{2}\left(Cs \cdot \frac{\lambda^2}{d^2} + \frac{d^2}{\lambda}\right) \quad \text{[Equation 1]}$$

where Δfc is a defocus amount of an objective lens giving high contrast to an input value d, Cs is a spherical aberration coefficient of an objective lens, λ is a wavelength of an electron beam, and d is a distance or spatial size between any two selected points, $$\Delta = Cc\sqrt{\left(\frac{\Delta V}{V}\right)^2 + \left(\frac{2\Delta I}{I}\right)^2 + \left(\frac{\Delta E}{V}\right)^2} \quad \text{[Equation 2]}$$

where Δ is a focal length variation of an objective lens, Cc is a chromatic aberration coefficient of an objective lens, ΔV/V is an accelerating voltage stability, ΔI/I is an objective lens current stability, and ΔE/V is a spread of energy in an electron beam to an accelerating voltage V, wherein one of the determined functions PCTFs in which the phase inversion component is relatively small is selected, the state of the one selected function PCTF is realized by the electron microscope by using the divergence angle β of the incident electron beam as a parameter, and a modulated value $\Delta I_d$ of the deflection coil current added to the deflection coil power source is determined by calculation of Equation 7, $$\Delta I_d = \frac{\sqrt{\frac{-d_{inv}^6 \cdot \ln[k \cdot PCTF(d_{inv})]}{\pi^2 \cdot (Cs \cdot \lambda^2 - d_{inv}^7 \cdot \Delta f_c)^2}}}{\xi} \quad \text{[Eqaution 7]}$$

where $\Delta I_d$ is a modulating signal added to a deflection coil current, $d_{inv}$ is a spatial frequency component giving a maximum phase inversion component, k is a proportionality constant, $PCTF(d_{inv})$ is an intensity of a phase inversion component before modulation, Cs is a spherical aberration coefficient of an objective lens, λ is a wavelength of an electron beam, Δfc is a defocus amount of an objective lens giving high contrast to an input value d, and ξ is a deflection angle per unit current of a deflection coil, (the proportionality constant k in Equation 7 is determined to be a value based on Equation 8)

$$0.1 \leq k \leq 0.2 \quad \text{[Equation 8]}$$

wherein the modulated value $\Delta I_d$ is superimposed on the deflection coil current of the deflection coil power source.

* * * * *